United States Patent [19]

Masao et al.

[11] Patent Number: 4,609,407
[45] Date of Patent: Sep. 2, 1986

[54] METHOD OF MAKING THREE DIMENSIONAL SEMICONDUCTOR DEVICES IN SELECTIVELY LASER REGROWN POLYSILICON OR AMORPHOUS SILICON LAYERS

[75] Inventors: Tamura Masao, Tokorozawa; Hirotsugu Kozuka; Yasuo Wada, both of Tokyo; Makoto Ohkura; Tamura Hiroshi, both of Hachioji; Takashi Tokuyama, Higashikurume; Takahiro Okabe, Tokyo; Osamu Minato, Kodaira; Shinya Ohba, Kokubunji, all of Japan

[73] Assignee: Hitachi, Ltd., Tokyo, Japan

[21] Appl. No.: 563,036

[22] Filed: Dec. 19, 1983

Related U.S. Application Data

[63] Continuation of Ser. No. 209,113, Nov. 21, 1980, abandoned.

[30] Foreign Application Priority Data

Nov. 21, 1979 [JP] Japan ................. 54-150080
Dec. 19, 1979 [JP] Japan ................. 54-164059

[51] Int. Cl.$^4$ ................. H01L 21/265; H01L 21/26
[52] U.S. Cl. ................. 148/1.5; 29/576 B; 29/576 T; 148/187; 427/53.1; 357/91
[58] Field of Search ............... 148/1.5, 187; 29/576 B, 29/576 T; 357/91

[56] References Cited

U.S. PATENT DOCUMENTS

| 4,269,631 | 5/1981 | Anantha et al. | 148/1.5 |
| 4,292,091 | 9/1981 | Togei | 148/1.5 |
| 4,319,954 | 3/1982 | White et al. | 156/628 |
| 4,375,993 | 3/1983 | Mori et al. | 148/1.5 |
| 4,377,031 | 3/1983 | Goto et al. | 29/576 B |
| 4,377,902 | 3/1983 | Shinada et al. | 29/576 B |
| 4,381,201 | 4/1983 | Sakurai | 148/1.5 |
| 4,409,724 | 10/1983 | Tasch et al. | 29/571 |

FOREIGN PATENT DOCUMENTS 42-12087  7/1967  Japan .
0142631  11/1981  Japan ................. 29/576 T

OTHER PUBLICATIONS

Tamura et al., Jap. Jour. Appl. Phys. 19 (1980) p. L-23.
Anantha et al., IBM-TDB, 22 (1979) 575.
Baeri et al., J. Appl. Phys. 50 (Feb. 1979), p. 788.
Gibbons et al., Appl. Phys. Letts. 34 (Jun. 1979) 831.
Bean et al., Appl. Phys. Letts. 33 (Aug. 1978) 227.

Primary Examiner—Upendra Roy
Attorney, Agent, or Firm—Antonelli, Terry & Wands

[57] ABSTRACT

Herein disclosed is a semiconductor device having at least one lower resistance region formed in the single-crystalline semiconductor film which is so formed to continuously coat both a single-crystalline semiconductor substrate and an insulating film formed on the surface of the substrate.

Since the aforementioned single-crystalline semiconductor film is used, many advantages which are not attained from the semiconductor device according to the prior art can be obtained.

The aforementioned single-crystalline semiconductor film is formed by irradiating a polycrystalline or amorphous semiconductor film with a laser beam.

38 Claims, 38 Drawing Figures

METHOD OF MAKING THREE DIMENSIONAL SEMICONDUCTOR DEVICES IN SELECTIVELY LASER REGROWN POLYSILICON OR AMORPHOUS SILICON LAYERS

This is a continuation of application Ser. No. 209,113, filed Nov. 21, 1980, now abandoned.

BACKGROUND OF THE INVENTION

1. Field of the Invention

The present invention relates to a semiconductor device and a fabricating method thereof, and more particularly to a semiconductor device in which a single-crystalline semiconductor film continuously formed on both the surface of a single-crystalline semiconductor substrate and an insulating film coating the substrate is constructed to have a lower resistance region, and a method of fabricating the semiconductor device by making use of the single-crystallization of a polycrystal through the irradiation with a laser beam.

2. Description of the Prior Art

FIG. 1(a) shows the cross-sectional construction of an insulated gate type FET (i.e., MOSFET) according to the prior art. The N-channel MOSFET according to the prior art is so constructed that N-type regions 12 and 13 acting as a source and a drain, respectively, are formed in a P-type substrate 11 and that a gate electrode 15 is attached to a gate insulating film 14. Incidentally, reference numeral 16 indicates an insulating film for inter-element isolation, which is selectively formed. According to this element construction, source and drain electrodes 17 and 18 have to be led out through holes (i.e., contact holes) which are smaller than the source and drain diffusion regions 12 and 13. As a result, the source and drain diffusion regions are made the same or larger than the contact holes, so that the parasitic capacitances $C_{DS}$ and $C_{SS}$ between those diffusion regions and the substrate 11 cannot be ignored. FIG. 1(b) shows an equivalent circuit of the MOSFET having the parasitic capacitances $C_{DS}$ and $C_{SS}$. A MOSFET 101 cannot realize a higher speed operation unless the parasitic capacitance $C_{DS}$ is reduced because the operating speed of the element is determined by the charging and discharging periods of the capacitance $C_{DS}$ and the capacitance of the next stage gate.

On the other hand, the leak currents between the source and drain diffusion regions and the substrate cannot be ignored, and the conventional MOSFET shown in FIG. 1 has a problem even in a low power consumption operation.

The drawback thus far described is substantially similarly experienced in other FET's than the MOSFET, i.e., a Schottky's barrier gate FET (i.e., SB FET) or a junction gate FET (i.e., J FET).

On the other hand, a bipolar transistor has many problems to be solved, e.g., the problem that the high-frequency characteristics are deteriorated due to the parasitic capacitance to be established between the base and the collector thereof.

SUMMARY OF THE INVENTION

It is therefore an object of the present invention to provide a semiconductor device which can solve the aforementioned problems concomitant with the prior art and which has a high performance, and a fabricating method thereof.

Another object of the present invention is to provide an FET (i.e., Field Effect Transistor) which has its parasitic capacitances reduced at its source and drain and which can operate at a high speed, and a fabricating method thereof.

Still another object of the present invention is to provide a bipolar transistor which has its parasitic capacitance reduced between its base and collector and which has excellent high-frequency characteristics, and a fabricating method thereof.

A further object of the present invention is to provide a semiconductor device having a novel construction by irradiation with a laser beam.

In order to achieve the aforementioned objects, the present invention provides a variety of semiconductor devices by continuously forming both the surface of a semiconductor substrate and an insulating film coating the semiconductor substrate with a polycrystalline or amorphous silicon film, by subsequently irradiating the polycrystalline or amorphous silicon film with a laser beam so that it may be single-crystallized, and by forming a desired portion of the single-crystalline silicon film with both a diffusion region (in the present Specification, the region which is formed by well-known impurity introducing means such as thermal diffusion or ion-implantation will be named simply as the diffusion region) and an electrode.

DESCRIPTION OF THE PREFERRED EMBODIMENTS

Figure 1A:
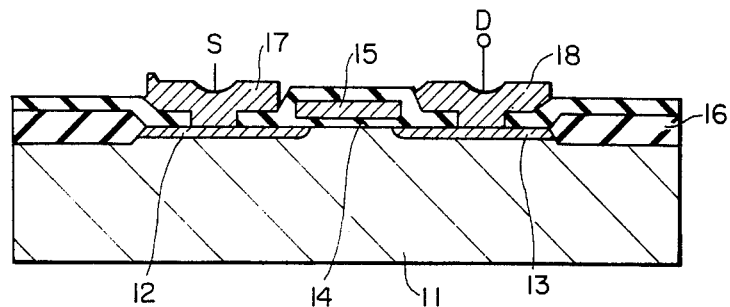
FIGS. 1(a)-1(b) is a schematic view showing both the cross-sectional construction of an FET according to the prior art and an equivalent circuit thereof.

As has been described above, the present invention is constructed by forming a diffusion region and an electrode in a single-crystalline silicon film which is continuously formed on the surface of a semiconductor substrate and on an insulating film.

First of all, therefore, the formation of such single-crystalline silicon film will be described in the following.

As is well known in the art, generally speaking, a single-crystalline thin film is formed by transferring such a substance as is necessary for the vapor epitaxial growth to a single-crystalline substrate, at a high temperature, through a gas phase chemical reaction so that the crystal may be grown within a time period of several or several ten minutes until it has a usual thickness of several micrometers.

In accordance with another method being currently used, after a single-crystalline substrate has a desired substance vapor deposition on its surface under a vacuum as high as $10^{-10}$ to $10^{-11}$ Torrs, it is heated to effect crystal growth thereby to form the desired single-crystalline thin film.

In accordance with either of those methods, since the substance to form the single-crystalline thin film is transferred to the single-crystalline substrate thereby to effect epitaxial growth, the use of the surface of the single-crystalline substrate has been indispensable thereby to make it impossible to form the single-crystalline film on an amorphous substance such as an insulating film.

In accordance with the recent remarkable development in a variety of semiconductor devices, however, the formation of the single-crystalline thin film even on an amorphous substance such as an insulating film has been earnestly desired, and researches therefor have been started.

For example, there has been proposed a method by which an $SiO_2$ film coating a substrate is coated all over its surface with amorphous silicon, after having been formed with a recess, and is irradiated with a laser beam. (M. W. Geis, et al., "Crystallographic orientation of silicon on an amorphous substrate using an artificial surface-relief grating and laser crystallization", Applied Physics Letter, 35(1), pp 71 to 74, 1 July, 1979).

According to the above proposal, it has been said that the amorphous silicon coating the aforementioned recess is first single-crystallized and that the amorphous silicon at the remaining portion is then gradually single-crystallized, too.

However, the method according to that proposal not only finds it difficult to accurately control the respective steps including the aforementioned groove formation, but also produces a single-crystalline film having questionable characteristics, so that the method has not been used yet for fabricating a variety of semiconductor devices.

On the other hand, there has also been proposed another method including the steps of: coating the surface of a semiconductor substrate with an insulating film such that the substrate is partially exposed to the outside; coating the insulating film and the exposed portion of the substrate surface with a semiconductor layer all over the surface; and irradiating the aforementioned semiconductor layer coating the aforementioned surface of the substrate with either an electron beam or a laser beam, while the position to be irradiated is consecutively shifted, thereby to single-crystallize the aforementioned semiconductor layer coating the insulating film by the zone-melting method (Japanese Patent Publication No. 42-12087).

However, neither the several zone-melting conditions necessary for forming a satisfactory single-crystalline silicon film have been disclosed, nor has the fabrication of a variety of semiconductor devices by forming a diffusion region in the single-crystalline silicon film formed been conducted.

In the present invention, the single-crystalline silicon film is formed by the following method.

Figure 2:
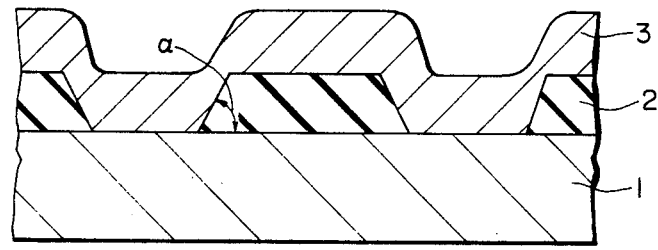
FIGS. 2, 3(a)-3(b) and 4(a)-4(c) are schematic views illustrating the formation of a single-crystalline semiconductor film according to the present invention.

As shown in FIG. 2, the surface of a single-crystalline Si substrate 1 is coated at desired portions with an amorphous $SiO_2$ film 2; the substrate is then further coated all over the surface with a polycrystalline Si film (or an amorphous Si film) 3.

Then, the whole surface is irradiated with a Q-switched pulse ruby laser beam to melt the aforementioned polycrystalline Si film 3.

Thus, the portion of the amorphous Si film 3 directly coated on the exposed surface of Si substrate 1 is single-crystallized by liquid phase epitaxial growth from the Si substrate 1 to provide surface orientation $\{h\ k\ l\}$.

On the other hand, the polycrystalline or amorphous Si film 3 coating the $SiO_2$ film 2 is melted by irradiation by the laser and is then formed with a number of crystal nuclei having random azimuthes, after having passed through a preset supercooling temperature $\Delta T$, thereby to effect polycrystalline growth.

Generally speaking, the aforementioned single-crystalline and polycrystalline growths are performed independently of each other. However, since the polycrystalline or amorphous Si film 3 on the $SiO_2$ film 2 has a supercooling temperature $\Delta T$, the growth of the polycrystal at that portion is retarded by $\Delta T/\Delta S$ (wherein $\Delta S$ designated a cooling rate) from that of the single-crystal at the portion contacting with the substrate 1.

At the portion contacting with the substrate, therefore, the single crystal which has previously started its growth exerts an influence upon the phenomenon that the molten liquid on the insulating film is separated from its supercooled condition.

The growth rate of a crystal is known to be the highest in a direction $<1\ 1\ 0>$, and this direction $<1\ 1\ 0>$ is at a right angle with respect to the crystal having the azimuth $\{h\ k\ l\}$ in case the azimuth of the single-crystalline substrate has a relationship of $h=k$.

Therefore, while the single crystal is growing in the direction $<h\ k\ l>$ at the portion contacting with the substrate 1, the single-crystalline growth in the direction $<1\ 1\ 0>$ is effected from the end portion of the single crystal. As a result, the amorphous silicon film 3 on the insulating film 2 is progressively single-crystallized from its both end portions until the amorphous or polycrystalline silicon film 3 is wholly converted into a single-crystalline film.

Since the range on the insulating film 2 where the amorphous or polycrystalline silicon film 3 can be single-crystallized, i.e., the distance in the plane direction to be single-crystallized, is determined by the ratio $\Delta T/\Delta S$, this value has to be increased as high as possible so as to single-crystallize the amorphous silicon film 3 over a wide range.

Since the cooling rate is remarkably high in the case of irradiation with a pulse laser, the time period of $\Delta T/\Delta S$ can be approximately considered as a time band as wide as the pulse width of the laser used so that the value is here present at 50 nanoseconds fore convenience purpose.

Since the maximum crystalline growth rate known until now is about 100 m/second for the case of dendrite or whisker growth, the range within which the single-crystallization can be effected for the aforementioned time period is about 5 $\mu$m if the crystallizing rate of the amorphous silicon film has a value of 100 m/second.

In order to enlarge the distance in the plane direction that can be single-crystallized, it is sufficient to elongate the time period of $\Delta T/\Delta S$, as has been described in the above. For this purpose, it is sufficient to irradiate the amorphous silicon film with the use of either a laser having a long pulse width or a CW laser so that the temperature of the molten liquid may be raised to elongate the time period of the molten state. In these ways, the amorphous silicon on the insulating film can be single-crystallized over a wide range. If a ruby laser beam having a pulse width of 1 microsecond and an intensity of 3 Joules/$cm_2$, for example, is used, the single-crystallization can be easily effected over about 100 $\mu$m in the planar direction.

EXAMPLE 1

As is shown in FIG. 2, the Si substrate 1 had its (100) surface formed (at a pitch of 2 $\mu$m by the usual photolithography) with a thermally oxidized film 2 having a width of 4 $\mu$m and a thickness of about 2500 Å.

Then, the Si substrate 1 with the oxidized film 2 was coated all over the surface by the well-known CVD technique with a polycrystalline silicon film 3 having a thickness of about 4000 Å.

The whole surface was then irradiated with a ruby laser beam having a pulse width of 25 nanoseconds with its Q switch being applied.

When the energy density of the laser beam used for the irradiation was 1.5 J/cm$^2$, a portion of the polycrystalline silicon film 3 is turned into a texture structure as shown in FIG. 3(a).

When the energy density of the laser beam used was 1.5 J/cm$^2$, more specifically, the polycrystalline silicon film having a thickness of about 4000 Å was not completely melted but the crystal grains were considerably larger.

However, the polycrystalline silicon film 3, which had been piled on the end portion of the oxide film 2, changed its texture in the <1 1 0> direction. The distance in the plane direction (growth length) of that changed texture was about 1.2 μm, as shown in FIG. 3(a), which implies that the growth of the crystal nuclei effected on the Si substrate was predominant in that direction. Incidentally, if the growth time period approximates the pulse width, the growth rate of the crystals in this instance is about 50 m/second.

Then, the whole surface was likewise irradiated with a laser beam having an energy density of 2.0 J/cm$^2$.

Figure 1B:
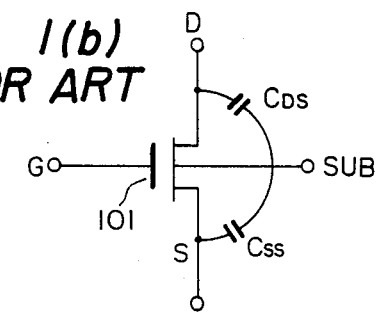

Thus, the polycrystalline silicon film 3 having the thickness of 4000 Å was completely melted so that it was wholly single-crystallized except its portion above and in the vicinity of the center portion of the oxide film 2, as shown in FIG. 3(b). At this time, the growth length of the single crystals above the SiO$_2$ film 2 was, as shown in FIG. 3(b), 1.2 μm, which was similar to the growth length of the changed texture when irradiation was effected at an intensity of 1.5 J/cm$^2$.

This means that there is a preset limit in the growth rate of the single crystals and that such growth length is a limit for the laser having the pulse width of about 50 nanoseconds.

In other words, since the cooling time period ΔT is elongated if the energy density of the laser is increased, the length of the single crystallization is elongated. However, if the energy density of the laser beam becomes excessive, the melted polycrystalline silicon film will flow to a lower portion, thus placing a limit in increasing the energy density of the laser beam. For instance, the maximum of the energy density to be used for the irradiation of the polycrystalline or amorphous silicon film having a thickness of about 4000 to 5000 π is about 2.0 J/cm$^2$.

In other words, the maximum thickness of the polycrystalline or amorphous silicon film to be single-crystallized with the pulse laser having the energy density of 2.0 J/cm$^2$ is about 5000 π. This maximum film thickness can be enlarged by increasing the energy density of the laser beam so that the film having a thickness up to about 1.5 μm can be single-crystallized by the use of the pulse laser having an energy density of 20 J/cm$^2$. However, since the insulating film has its surface melted and fluidized if the energy density of the laser is made excessive, the maximum energy density of the laser usable in the present invention, for practical purposes is frequently selected at a value of about 3 J/cm$^2$. In this instance, consequently, the single-crystallization can be effected, and the thickness of the polycrystalline or amorphous silicon film is about 1 μm.

On the contrary, the minimum energy density of the laser to be used in the present invention is about 1 J/cm$^2$.

In other words, the single-crystalline silicon film to be used in the fabricating field of the semiconductor device is required to have a thickness equal to or larger than about 1000 π. If the film thickness is smaller than 1000 π, it becomes remarkably difficult to form the junction. In case the polycrystalline or amorphous silicon having a thickness of 1000 π is irradiated with a laser beam, the energy density in which the transverse single-crystalline growth is started is about 1 J/cm$^2$ so that the energy density of the laser beam to be used in the present invention has to be equal to or higher than about 1 J/cm$^2$.

In case the single-crystallization is to be accomplished with the use of a pulse laser, repetition of the irradiation is effective for enlarging the plane length to be single-crystallized. Thus, the single-crystallization can be gradually progressed, while using as the nuclei for the growth the portion which has been single-crystallized by the previous irradiation, so that a single-crystalline thin film having a large area can be prepared.

The use of a continuous-wave (CW) oscillating laser is also effective for enlarging the single-crystallizable length thereby to form a single-crystalline film having a large area.

Figure 3:
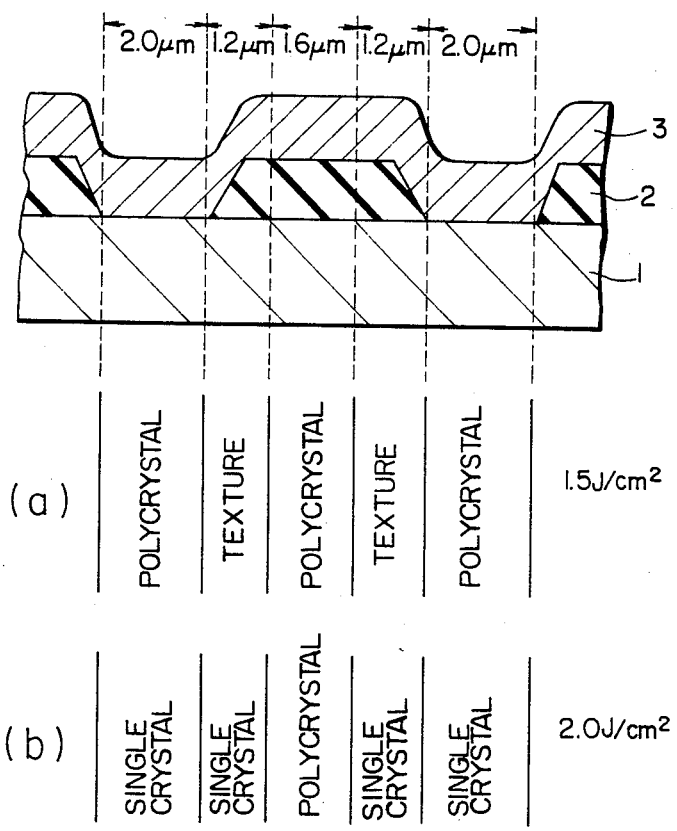

More specifically, the construction shown in FIG. 3 was scanned with the use of the CW argon laser having an output of 15 W under the conditions of a beam diameter of 50 μm (or an energy of 10 W) and a scanning rate of 5 m/second. Thus, the time period for maintaining the molten state was about several microseconds so that the polycrystalline or amorphous film 3, including its portion above the SiO$_2$ film 2, could be wholly single-crystallized. The energy when the CW laser is used is preferably set at 5 to 20 W.

In order to dope the single-crystalline film with an impurity, prior to the single crystallization with the laser beam, the polycrystalline or amorphous silicon film may be doped with a desired impurity by ion-implantation or thermal diffusion and then single-crystallized or by irradiation with a laser beam. For instance, if the silicon film is single-crystallized by irradiation with the laser beam after it has been doped with an impurity of 2 to 3×10$^{16}$/cm$^2$, a sheet resistance of 2 to 3 Ω/□ can be obtained.

Since it is necessary in the present invention that the laser can melt the polycrystalline or amorphous silicon, it goes without saying that all the lasers that can melt such silicon can be used. When the single-crystallization is to be effected by the scanning process, the scanning rate is suitably selected in accordance with the kind of the laser used.

Although the foregoing description has been directed to the case in which an SiO$_2$ film was used as the insulating film, it is quite natural in the present invention that the insulating film which has the single-crystalline silicon film formed thereon need not be limited to the SiO$_2$ film, and it is possible to widely use a variety of insulating films generally used in semiconductor devices, such as a film of Si$_3$N$_4$, Al$_2$O$_3$ or phosphorous glass.

The angle α between the side of one of those insulating films and the silicon substrate (as shown in FIG. 2) is about 45 degrees in a usual case, and there is no difference established in the mode of the crystal growth, generally speaking, if that angle is equal to or smaller than a right angle.

The method of fabricating the semiconductor device by subjecting the single-crystalline silicon film, which has been prepared by the aforementioned method, to the treatment of ion-implantation or diffusion will be described in the following.

If a variety of semiconductor elements such as transistors or diodes are formed in the single-crystalline silicon film on the insulating film, these semiconductor elements are insulated and isolated from the semiconductor substrate by means of the insulating film, thus providing an advantage that the parasitic capacitance can be remarkably reduced in comparison with that of the case in which the isolation is effected by a PN junction.

As is different from an SOS (or Silicon-On-Sapphire), there can be obtained another advantage that the substrate itself can be used as a portion of the semiconductor element.

Figure 4A:
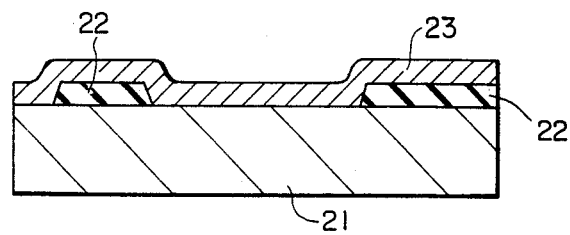

First of all, as shown in FIG. 4(a), a single-crystalline Si substrate 21 is formed with an SiO$_2$ layer 22 having a selective opening and then has formed all over the surface thereof an amorphous or polycrystalline Si layer 23. The formation of those films are all performed by methods well known in the field of fabricating semiconductor devices, such as CVD. The thicknesses of the aforementioned SiO$_2$ film and amorphous or polycrystalline silicon film 22 and 23 were made about 1 μm and 0.5 μm, respectively.

Figure 4B:
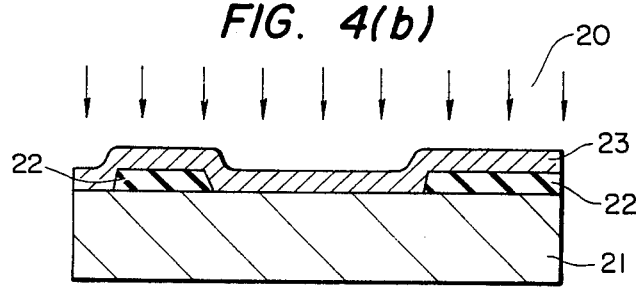

As shown in FIG. 4(b), the aforementioned amorphous or polycrystalline silicon film 23 was then irradiated all over its surface with a Q switched ruby laser 20 having a pulse width of about 30 nanoseconds and an energy density of about 2 J/cm$^2$.

Figure 4C:
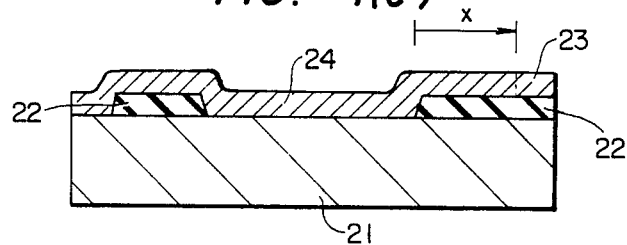

As a result, the aforementioned amorphous or polycrystalline silicon film 23 was instantly heated and melted at a high temperature and was rearranged in accordance with the crystal axis of the substrate 21 so that a single-crystalline silicon layer 24 was grown in a portion of film 23 above the SiO$_2$ layer 22, as shown in FIG. 4(c).

The length x of the single-crystalline silicon layer 24, which has unidirectionally grown on the SiO$_2$ film 22, is different in accordance with the intensity of the irradiation energy, the time period of the irradiation and the roughnesses of the surface of the amorphous or polycrystalline silicon film, but was about 5 μm under the aforementioned conditions.

Consequently, if the amorphous or polycrystalline silicon film on the SiO$_2$ film is single-crystallized from both sides, an SiO$_2$ film having a length of about 10 μm can be coated with the single-crystalline silicon film.

The method of forming the single-crystalline silicon by laser irradiation will be referred to as the "laser anneal epitaxy".

As a result, the FET, bipolar transistor and diode, which have different construction and characteristics from those of the prior art, can be fabricated by forming the single-crystalline silicon film continuously coating the semiconductor substrate and the insulating film by the laser anneal epitaxy and by forming the single-crystalline silicon film thus prepared with the diffusion region and the electrode.

EXAMPLE 2

Figure 5A:
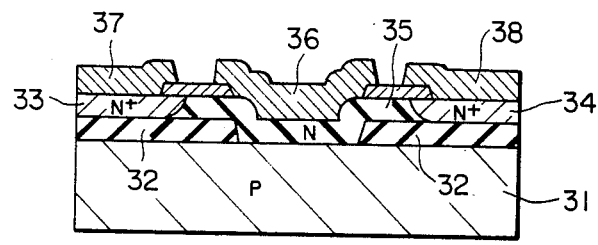
FIGS. 5(a)-5(b) to 16(a)-16(c) are schematic views showing respectively different embodiments of the present invention.
Figure 5B:
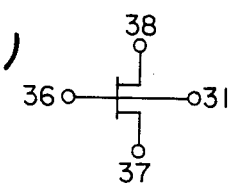

The present example is directed to the fabrication of an FET (i.e., the SB-FET), which has a Schottky gate, with the use of the single-crystalline silicon film which has been prepared by the method shown in FIGS. 4(a), (b) and (c). FIG. 5(a) shows the sectional construction of the SB-FET thus fabricated, and FIG. 5(b) shows an equivalent circuit thereof.

In FIG. 5: reference numeral 31 indicates a P-type silicon substrate; numeral 32 an SiO$_2$ film; and numerals 33 and 34 the source and drain, which are constructed of N$^+$ regions formed by diffusion or ion implantation, respectively, and which are formed in the single-crystalline silicon film 35 prepared by the laser anneal epitaxy. Numerals 36, 37 and 38 indicate a Schottky barrier gate electrode, a source electrode and a drain electrode, respectively.

Since the SB-FET in the present invention has its source and drain 33 and 34 and its silicon substrate 31 isolated by means of the SiO$_2$ film 32, the capacitances of the source 33 and the drain 34 relative to the substrate 31 are so reduced that the high-frequency characteristics can be made excellent. Moreover, controls for both the depletion and enhancement types can be made by holding the substrate 31 at a suitable potential with respect to the source 33. Still moreover, since the drain 34 is isolated by means of the SiO$_2$ film 32, a high voltage resistance can be ensured. Incidentally, if the Schottky gate is replaced by a PN junction gate, a JFET can be fabricated.

EXAMPLE 3

Figure 6A:
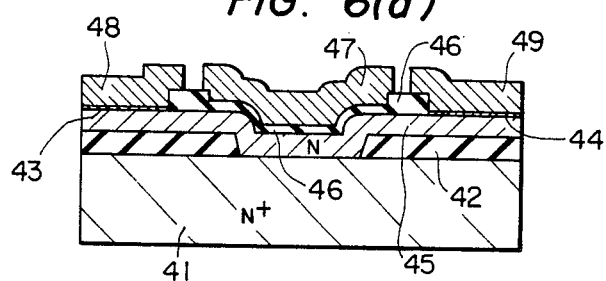

FIG. 6(a) shows the sectional construction of a MOSFET which has its source and drain made of Schottky contact 43 and 44.

In FIG. 6(a): reference numeral 41 indicates an N$^+$-type single-crystalline Si substrate; numeral 42 an insulating film of SiO$_2$ or the like; numerals 43 and 44 the Schottky contacts; numeral 45 the N-type single-crystalline Si layer (which has been prepared by laser anneal epitaxial growth); numeral 46 a gate insulating film of SiO$_2$ or the like; numeral 47 a gate electrode; and numerals 48 and 49 source and drain electrodes, respectively.

Figure 6B:
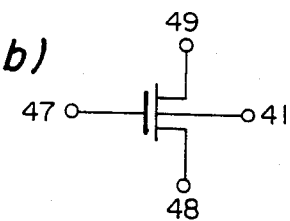

FIG. 6(b) shows an equivalent circuit of that MOSFET, which has the same characteristics as those disclosed by the Example 2.

EXAMPLE 4

Figure 7A:
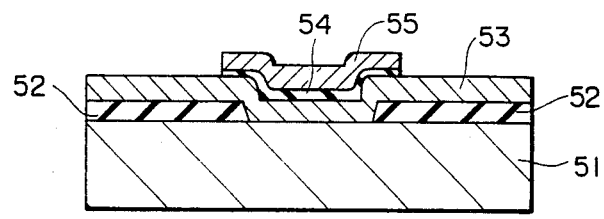
Figure 7B:
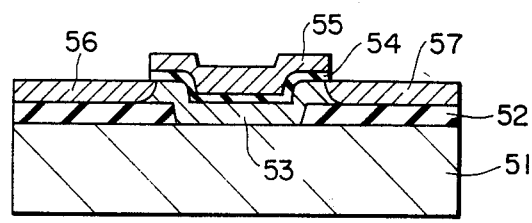
Figure 7C:
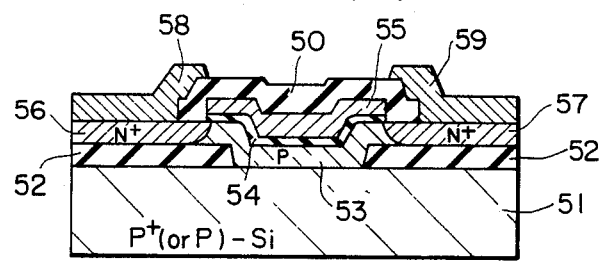

FIG. 7 shows an example in which the usual MOSFET is fabricated according to the present invention, with FIGS. 7(a) to (c) illustrating the fabricating steps.

The SiO$_2$ film 52 and the single-crystalline silicon film 53 have been prepared by the steps illustrated in FIG. 2. The SiO$_2$ film 52 has its open portion formed with both a gate insulating film (of SiO$_2$) 54 and a gate electrode 55 made of a polycrystalline Si layer by the usual steps. (FIG. 7(a)) Then, the single-crystalline Si layer 53 on the SiO$_2$ film 52 is doped with an impurity, while masking said gate electrode 55, by the ion-implantation or thermal diffusion method, thereby to form N$^+$-type regions, i.e., source and drain 56 and 57. (FIG. 7(b)) After that, an insulating film 50 of SiO$_2$ or the like is further formed, and electrode lead-in holes are etched, and then source and drain electrodes 58 and 59 of Al or the like are formed. (FIG. 7(c)) In FIG. 7, incidentally, reference numeral 51 indicates a P$^+$ (or P)-type single-crystalline Si body (e.g., substrate, epitaxial layer or embedded layer), and numeral 52 indicates a desired insulating film which is selected from the group including an SiO$_2$ film, an Si$_3$N$_4$ film, and Al$_2$O$_3$ film and a phosphorous film. On the other hand, the single-crystalline Si layer 53 was of P-type with a view to fabricating an N-channel enhancement type MOSFET, but may be of N-type in order to fabricate a depletion type MOSFET. Moreover, if the conductivity types of the respective layers are inverted, it is quite natural that a P-channel MOSFET can be fabricated. Incidentally, the conductivity type of the single-crystalline Si layer 53 can be determined such that the doping with an impurity of a desired conductivity type is effected by the ion-implantation and thermal diffusion method before or after the single-crystallization is effected by the irradiation with the laser. It goes without saying that the doping of the impurity can be performed simultaneously with the formation of either the amorphous Si or the polycrystalline Si.

As is apparent from FIG. 7(c), since the source and drain regions 56 and 57 exist on the insulating film 52, the parasitic capacitance with the substrate 51 is low, the high-frequency characteristics are excellent, the leak current between the source and drain regions and the substrate is little, and the drain voltage resistance is high.

Thus, by forming the source and drain in the single-crystalline semiconductor layer, overlaid on the insulating film, which has been prepared by the laser anneal epitaxial growth method, there can be obtained the improvement that the FET can have its capacitances remarkably reduced between its source and drain and its substrate, that the concentration of the impurity in the substrate can be freely changed (thereby to alloy the coexistence and composition with another element) and that the drain voltage resistance is high.

Figure 7D:
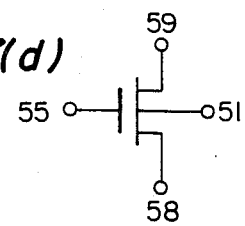

Incidentally, FIG. 7(d) is a diagram showing an equivalent circuit of the MOSFET having the construction shown in FIG. 7(c).

Although, in the Examples 2 to 4 thus far described, both the source and drain of the FET are formed in the single-crystalline semiconductor layer on the insulating film, only one (e.g., the drain) may be formed, if necessary, in the single-crystalline silicon film on the insulating film. Moreover, although the region between the source and drain contacts with the substrate, it can be formed on the insulating film so that all the regions of the FET can be formed in the single-crystalline layer on the insulating film.

EXAMPLE 5

Although, in all the aforementioned Examples, only one layered single-crystalline silicon was formed, the construction of single crystal—insulating layer—single crystal can be made in a laminated manner by repeating the steps illustrated in FIGS. 4(a) to (c).

Figure 8:
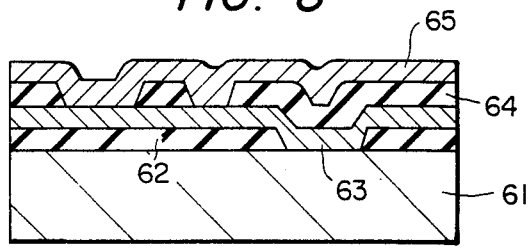

FIG. 8 shows an example, in which a single-crystalline semiconductor substrate 61 has an insulating film 62, then a single-crystalline semiconductor layer 63, then an insulating film 64, and then a single-crystalline semiconductor layer 65 formed thereon. It is needless to say that the single-crystalline semiconductor layers 63 and 65 are formed by first and second laser anneal epitaxial growths.

EXAMPLE 6

The present example is directed to a semiconductor device having such a construction as has FETs formed in a vertical direction with the use of two single-crystalline silicon films which have been prepared in accordance with Example 5.

Figure 9A:
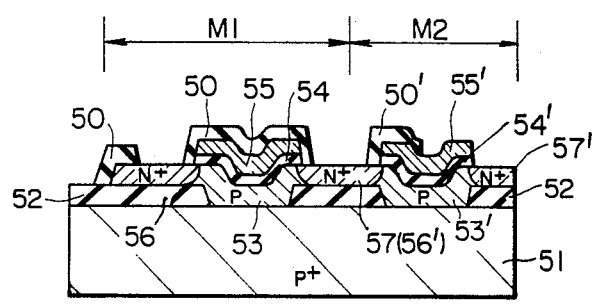
Figure 9B:
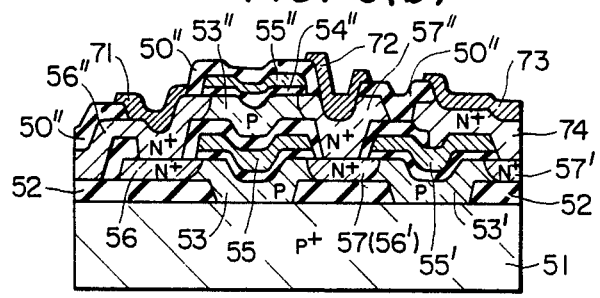

FIG. 9(a) shows the case in which the single-layered single-crystalline silicon film 53 is prepared and then is formed with two MOSFETs M1 and M2, and FIG. 9(b) shows the case in which a single-crystalline silicon film 53' is further prepared thereon and is formed with a third MOSFET (wherein reference numeral 56" indicates a source, numeral 57" a drain; and numeral 55" a gate).

Figure 9C:
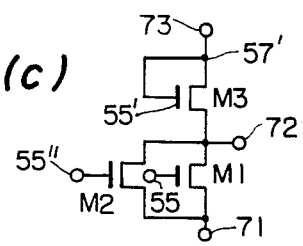
Figure 10A:
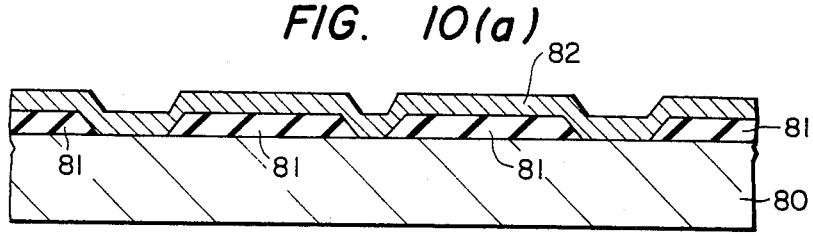
Figure 10B:
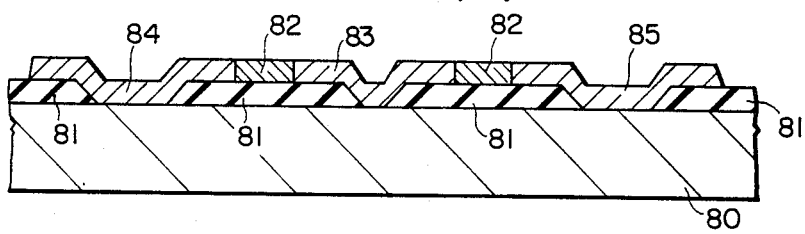
Figure 10C:
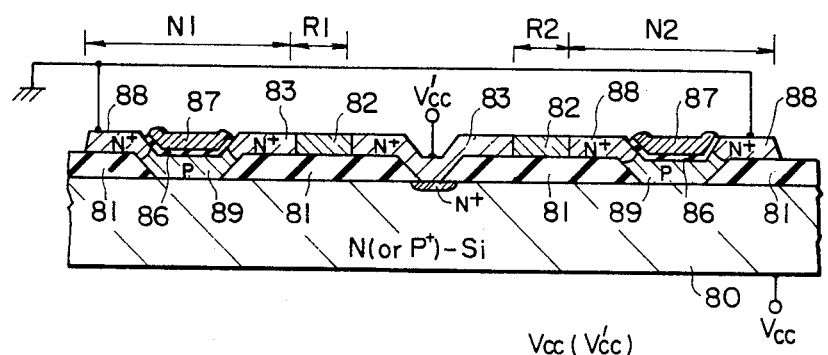
Figure 10D:
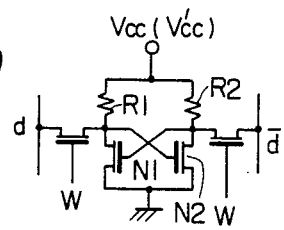

In FIG. 9(b), reference numerals 71, 72 and 73 indicate electrodes made of Al or the like; and numeral 74 indicates the N+-type regions connecting the drain (57') and gate (55') of the MOSFET M2. FIG. 9(c) shows an equivalent circuit of that MOSFET circuit.

Thus, high integration can be effected by fabricating the semiconductor elements such as the FEts vertically, and it is possible to obtain such remarkably excellent characteristics that the parasitic and wiring capacitances are reduced to far lower values than those of the prior art.

EXAMPLE 7

FIG. 10 shows an example of an integrated circuit which is constructed of MOSFETs according to the present invention, using a memory cell of an MOS type static RAM as an example. First of all, as shown in FIG. 10(a), an N-type single-crystalline Si substrate 80 has an SiO$_2$ layer 81 formed thereon in a selective manner, and then a polycrystalline Si layer 82 is formed all over the surface of the substrate. Then, the irradiation with a laser beam is effected to grow single-crystalline silicon layers 83, 84 and 85. If the transverse size of the SiO$_2$ layer 81 is taken at a suitable length, it is possible to leave portions of the polycrystalline layer 82 non-single crystallized (FIG. 10(b)). Then, a P-type impurity is implanted into a desired region of the single-crystalline silicon film thereby to form a P-type region 89, and further a gate oxide film (of SiO$_2$ or the like) 86, a gate electrode (of a polycrystalline Si film) 87 and an N+-type high concentration impurity layer 88 are formed. At the same time, the region 83 is also made into a high concentration N+-type layer which is similar to the region 88. On the other hand, the polycrystalline layer 82 is maintained under the so-called "non-doped" condition so that it is used as a highly resistive layer having a resistance equal to or higher than $10^8 \Omega$. FIG. 10(d) shows the circuit which is constructed of the device shown in FIG. 10(c). This circuit is the flip-flop type memory cell which is used at present in the static type memory. As is apparent from FIG. 10(c), since the source drain region 88 is isolated through the SiO$_2$ film 81 from the substrate 80, its capacitance therewith is so low that the switching speed can be remarkably improved. If the N-channel MOSFET is so constructed that the region 88 is used as an N+-type impurity layer while the region 89 of the MOSFET is used as a P-type film, the semiconductor substrate 80 can be of the N-type thereby to make it possible to fabricate a highly reliable semiconductor device, in which soft errors due to $\alpha$ particles, as raise a problem in semiconductor memories at present, can be remarkably decreased. Incidentally, even if the semiconductor substrate 80 is of the P-type (or P+-type) having a high concentration, the soft errors can be decrease, but the potential at the power source terminal becomes $V_{CC}'$.

Moreover, although the resistor is used as the load of the memory cell, another element such as a MOSFET (e.g., a MOSFET similar to those N1 and N2 of the MOSFET formed on the single-crystalline layer on the insulating film) can also be used.

EXAMPLE 8

Figure 11A:
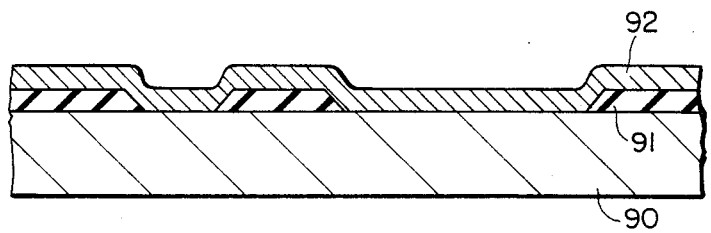
Figure 11B:
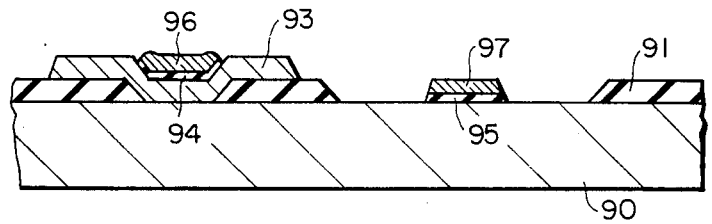
Figure 11C:
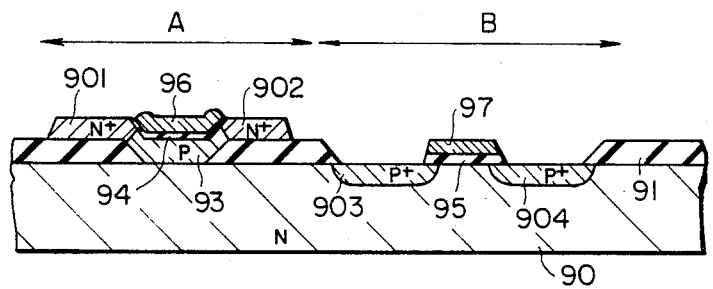

FIG. 11 shows an example of a C-MOS using a MOSFET according to the present invention. An N-type single-crystalline Si substrate 90 has an SiO$_2$ layer 91 formed thereon in a selective manner, and then a polycrystalline Si layer 92 is formed all over the substrate surface (FIG. 11(a)). Then, irradiation with a laser beam is effected to grow the single crystal, and portions other than single-crystallized film 93 is removed. Ions such as boron are implanted into the single-crystalline silicon film 93 thereby to convert the same into a P-type film. Then, a well-known method such as CVD is used to form gate oxide films (of SiO$_2$ or the like) 94 and 95 and gate electrodes (of a polycrystalline Si layer or the like) 96 and 97, as shown in FIG. 11(b). Then, another ion implantation, of phosphorous, is effected at a region A, as shown in FIG. 11(c), to form N$^+$-type regions acting as a source 901 and a drain 902. On the other hand, ions of boron are implanted into a region B thereby to form P$^+$-type regions acting as a source 903 and a drain 904. As shown in FIG. 11(c), the regions A and B are formed with N- and P-channel MOSFETs, respectively, so that these two kinds of elements constitute the CMOS circuit. According to a first feature of the present invention, the silicon film 93 of the N-channel MOSFET is formed at an upper portion of the surface of the semiconductor substrate 90 and is isolated through the SiO$_2$ film 94 from the source 903 of the P-channel MOSFET, so that the parasitic thyristor effect, which has raised a problem in the CMOS circuit having the conventional construction, is remarkably reduced. Moreover, the region necessary for element isolation between the P- and N-type MOSFETs can be reduced to zero in a planar manner so that the integration density can be improved. According to a second feature of the present invention, moreover, it is possible to provide a semiconductor device which has its soft errors so remarkably reduced that it can enjoy high reliability, as has been described in Example 7. Incidentally, although the description of the present Example has been made upon the case in which the impurities in the substrate and in the source drain region are of N- and P-types, respectively, the effects obtainable in the present invention are unchanged even if the impurities of the completely opposite conductivity types to those of the present Example are used.

EXAMPLE 9

Figure 12:
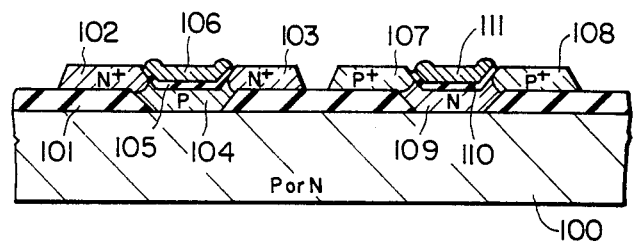

FIG. 12 shows another example of a C-MOS which uses the MOSFET of the present invention. A substrate 100 has an SiO$_2$ layer 101 formed thereon, and this substrate and a single-crystalline Si layer formed on the SiO$_2$ layer have a P-type impurity layer 104 and N-type source drain layers 102 and 103 formed therein; a gate oxide film 105, and a polycrystalline Si layer 106 acting as a gate electrode, are provided thus constructing the N-channel MOSFET. On the other hand, a P-channel MOSFET is constructed of an N-type impurity layer 109, P-type source drain layers 107 and 108, a gate oxide film 110 and a polycrystalline Si layer 111 acting as a gate electrode. Since the junction capacitances between the impurity layers acting as the source drain of the P-channel MOSFET and the substrate are remarkably reduced in comparison with Example 8, the switching time period of the circuit can be so reduced as to increase the switching rate.

It is naturally apparent that the combination of the constructions shown in FIG. 11(c) and FIG. 12 will further enhance the effect of the present invention. On the other hand, although the element on the SiO$_2$ layer formed selectively on the substrate has been described to be constructed of only the single layer in the present Example, it is apparent from the present invention that a multi-layered construction can be made to remarkably improve the integration, if desired.

Moreover, although the C-MOS is fabricated in FIGS. 11 and 12, it is also natural that the two MOSFETs may be of the same channel-type.

EXAMPLE 10

Here, an example in which a bipolar transistor is fabricated in accordance with the present invention will be described.

Figure 13A:
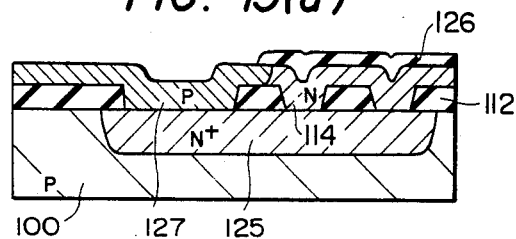

First of all, as shown in FIG. 13(a), after a P-type silicon substrate 100 has an N$^+$-type layer 125 formed as a surface region thereof, the aforementioned method is used to form an N-type single-crystalline silicon layer 114 by laser irradiation so that a P-type diffusion layer 127 acting as a base is formed by using an SiO$_2$ layer 126.

Figure 13B:
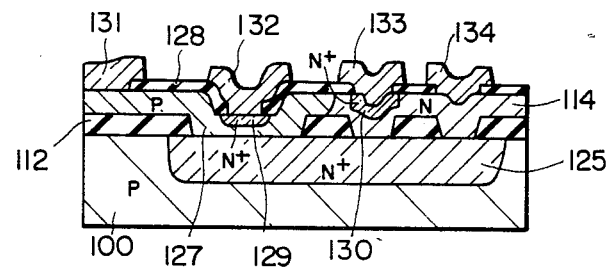
Figure 13C:
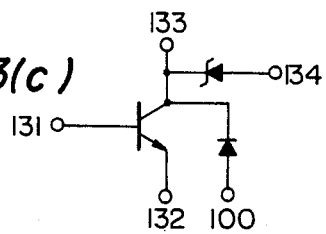

As shown in FIG. 13(b), if an N$^+$-type emitter 129, a collector electrode lead-in N$^+$-type layer 130, and electrodes 131 to 134 of Al of the like, are formed by the usual bipolar steps, then an element having the circuit shown in FIG. 13(c) is fabricated. Incidentally, the electrode 134 constitutes a Schottky diode together with the N-type layer 114.

The element thus fabricated is characterized in that the P-type single-crystalline silicon layer formed by irradiation with the laser is led out as the lead electrode of the base 127 onto the SiO$_2$ film 112 and in that the area of the connecting portion between the base and the collector is remarkably small.

As a result, the parasitic capacitance between the base and the collector is so reduced as to make the high-frequency characteristics excellent and as to reduce the size of the element.

EXAMPLE 11

Figure 14:
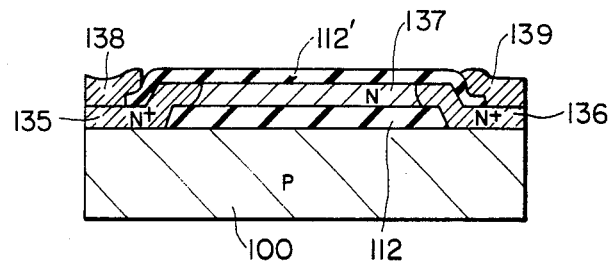

FIG. 14 shows a further embodiment of the present invention, in which both a single-crystalline layer prepared by laser irradiation and a polycrystalline layer are used as resistors.

In FIG. 14, reference numerals 135 and 136 indicate N$^+$-type single-crystalline layers prepared by the laser irradiation; numeral 137 an N-type polycrystalline layer; numerals 112 and 112' insulating layers; and numerals 138 and 139 electrodes made of a higher conductive metal such as Al.

The polycrystalline silicon film 137 having a low impurity concentration acts as a resistor, and the electric contact between the electrodes 138 and 139 is made excellent by the single-crystalline silicon films 135 and 136 which have a high impurity concentration and a low resistance.

EXAMPLE 12

Figure 15A:
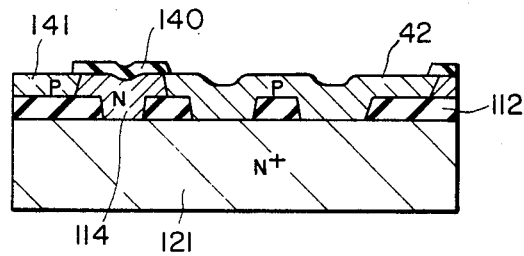
Figure 15B:
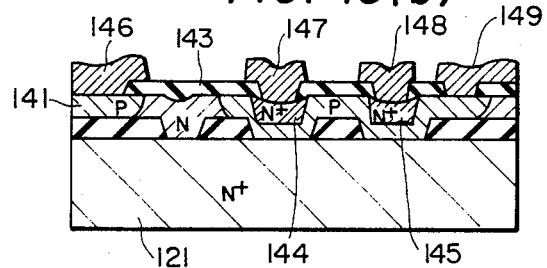
Figure 15C:
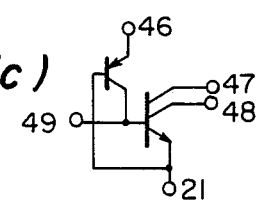

FIG. 15 shows an example in which a semiconductor device, i.e., the so-called "I$^2$L", is fabricated in accordance with the present invention in a similar method to the case of the aforementioned bipolar NPN element.

The present Embodiment is characterized in that a high injection efficiency can be obtained because an injector 141 is formed on the SiO$_2$ film 112 by laser irradiation and in that, since the outside base of a base 142 is formed on the SiO₂ film 112, there are neither parasitic capacitance nor parasitic injection so that the current control Beff of the semiconductor device I²L and the speed ft can be made sufficiently high.

Incidentally, in FIG. 15, reference numeral 121 indicates an N⁺-type emitter base; numeral 143 as insulating film; numerals 144 and 145 N⁺-type collectors; numeral 146 an injector electrode; numerals 147 and 148 collector electrodes; and numeral 149 a base electrode.

EXAMPLE 13

The single-crystalline silicon layer prepared by the present invention is divided into a plurality of regions by means of an insulating material so that both the portion isolated from the substrate and the portion connected with the same are formed with elements, respectively.

Figure 16A:
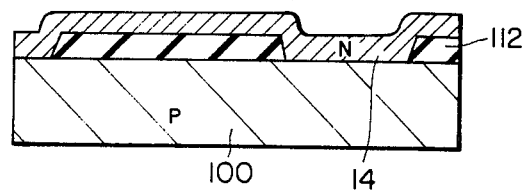
Figure 16B:
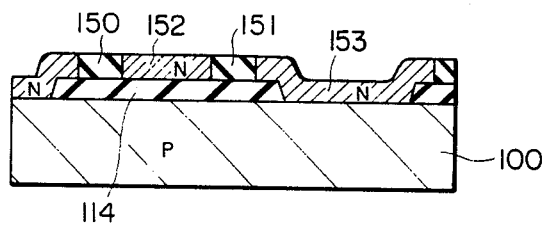

FIG. 16 shows one example thereof. First of all, as shown in FIG. 16(a), the P-type silicon substrate 100 has an SiO₂ film 112 formed thereon, and then an N-type single-crystalline layer 114 is formed, in accordance with the aforementioned method. Next, as shown in FIG. 16(b), if insulating layers 150 and 151 are formed, a portion 152 isolated into an island shape and a portion 153 connected with the substrate 100 are formed. The insulating layers 150 and 151 may naturally be made of SiO₂, but the portions 152 and 153 may be aerially isolated merely by an etching step.

Moreover, the SiO₂ isolation may be effected by the LOCOS technique which has been generally used in the prior art. Since island regions having different characteristics can be formed in the manner thus far described, elements according to the respective characteristics can be fabricated, which is highly advantageous in practice.

Figure 16C:
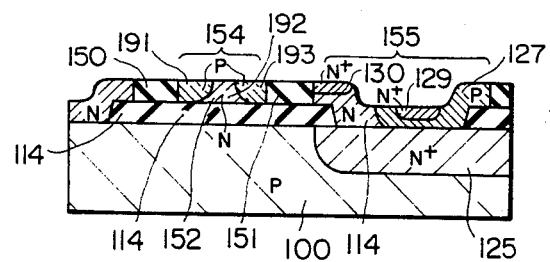

FIG. 16(c) shows one example thereof, in which a lateral PNP transistor (wherein numeral 191 indicates a P-type emitter; numeral 192 an N-type base; and numeral 193 a P-type collector) is formed in the completely isolated island region and in which a longitudinal NPN transistor (wherein numeral 129 indicates an N-type emitter; numeral 127 a P-type base; and numerals 114, 125 and 130 N-type collectors) is formed in the region connected with the substrate. Since the lateral PNP transistor is completely isolated from the surroundings in that way, it can enjoy a high current gain and high frequency characteristics even if it is of small size.

As is apparent from the description thus far made, according to the present invention, a variety of semiconductor elements such as bipolar transistors, FETs, diodes and resistors can be formed using the single-crystalline semiconductor film which is continuously formed on the surface of the substrate and on the insulating film. It goes without saying that those various semiconductor elements are not limited to one kind but that two or more kinds of semiconductors can be formed in a single single-crystalline semiconductor film.

We claim:

1. A method of fabricating a semiconductor device, comprising:
   (a) coating a surface of a single-crystalline silicon semiconductor substrate at a desired portion with an insulating film, said single-crystalline silicon semiconductor substrate having at least one impurity-doped region in its surface region;
   (b) coating said single crystalline silicon semiconductor substrate and said insulating film with either a polycrystalline silicon semiconductor film or an amorphous silicon semiconductor film such that at least a portion of the exposed surface of the single-crystalline silicon semiconductor substrate and a desired portion of the insulating film are continuously covered;
   (c) irradiating the polycrystalline silicon semiconductor film or said amorphous silicon semiconductor film on the exposed surface of the single-crystalline semiconductor substrate and on the desired portion of the insulating film with a laser beam so that at least a portion of the irradiated film on said desired portion and the irradiated film on the exposed surface of the substrate is single-crystallized, so as to form a single-crystalline silicon semiconductor film continuously coating both the surface of said single-crystalline silicon semiconductor substrate and the desired portion of said insulating film, said single-crystalline silicon semiconductor substrate acting as a seed for the single-crystallizing of said at least a portion of the irradiated film on said desired portion and said irradiated film on the exposed surface of the single-crystalline silicon semiconductor substrate; and
   (d) forming at least on pn-junction in the single-crystallized portion of the semiconductor film.

2. A method according to claim 1, wherein said irradiation is performed with the use of a pulse laser.

3. A method according to claim 1, wherein said irradiation is performed with the use of a continuous wave oscillatory laser.

4. A method according to claim 1, wherein the irradiation is performed over the entire part of the polycrystalline or amorphous silicon semiconductor film, to be irradiated, at one time.

5. A method according to claim 1, wherein the coating step (b) includes coating the entire surface of the insulating film with a polycrystalline silicon semiconductor film or an amorphous silicon semiconductor film, and wherein the forming step (c) includes irradiating the entire polycrystalline or amorphous silicon semiconductor film with a laser beam to melt the semiconductor film.

6. A method according to claim 2, wherein the energy density of said laser is about 1 to 20 J/cm².

7. A method according to claim 3, wherein the energy of said laser is about 5 to 20 W.

8. A method according to claim 5, wherein the irradiation is performed over the entire polycrystalline or amorphous silicon semiconductor film at one time.

9. A method according to claim 6, wherein said polycrystalline silicon semiconductor film or amorphous silicon semiconductor film has a thickness of 1000 Å to 1.5 μm.

10. A method according to any one of claims 1, 2, 6 or 3, wherein said insulating film is made of a material selected from the group consisting of SiO₂, Si₃N₄, Al₂O₃ and phosphorous glass.

11. A method according to any one of claims 1, 2, 6, 3 or 7, wherein the thickness of said polycrystalline silicon semiconductor film or said amorphous silicon semiconductor film is about 1000 Å to 1 μm.

12. A method according to claim 1, wherein the polycrystalline silicon semiconductor film or amorphous silicon semiconductor film has a thickness of at least 1000 Å.

13. A method according to claim 1, wherein the polycrystalline silicon semiconductor film or amorphous silicon semiconductor film has a thickness sufficient such that pn-junctions can be formed therein.

14. A method according to claim 12, wherein the laser beam used to irradiate the polycrystalline silicon semiconductor film or amorphous silicon semiconductor film has an energy density of at least 1 J/cm$^2$.

15. A method according to claim 14, wherein the insulating film is formed of a material selected from the group consisting of $SiO_2$, $Si_3N_4$, $Al_2O_3$ and phosphorous glass.

16. A method according to claim 13, wherein the laser beam used to irradiate the polycrystalline silicon semiconductor film or amorphous silicon semiconductor film has a sufficient energy density to melt the polycrystalline or amorphous silicon semiconductor film.

17. A method according to claim 16, wherein the insulating film is formed of a material selected from the group consisting of $SiO_2$, $Si_3N_4$, $Al_2O_3$ and phosphorous glass.

18. A method of fabricating a semiconductor device, comprising:
   forming at least one impurity doped region in a surface region of a single crystalline silicon semiconductor substrate;
   coating the surface of the single-crystalline silicon semiconductor substrate at a portion thereof with an insulating film, leaving exposed a portion of the surface of the semiconductor substrate;
   coating said single crystalline silicon semiconductor substrate and said insulating film with either a polycrystalline silicon semiconductor film or an amorphous silicon semiconductor film such that at least a portion of the exposed surface of the single-crystalline silicon semiconductor substrate and a desired portion of the insulating film are continuously covered;
   irradiating the polycrystalline silicon semiconductor film or said amorphous silicon semiconductor film on the exposed surface of the single-crystalline silicon semiconductor substrate and on the desired portion of the insulating film with a laser beam so that at least a portion of the irradiated film on said desired portion and the irradiated film on the exposed surface of the substrate is single-crystallized, so as to form a single-crystalline silicon semiconductor film continuously coating both the surface of said single-crystalline silicon semiconductor substrate and the desired portion of said insulating film, said single-crystalline silicon semiconductor substrate acting as a seed for the single-crystallizing of said at least a portion of the irradiated film on said desired portion and said irradiated film on the exposed surface of the single-crystalline silicon semiconductor substrate; and
   forming at least one pn-junction in the single-crystallized portion of the semiconductor film.

19. A method according to claim 18, wherein the polycrystalline silicon semiconductor film or amorphous silicon semiconductor film has a thickness sufficient such that pn-junctions can be formed therein.

20. A method according to claim 19, wherein the laser beam used to irradiate the polycrystalline silicon semiconductor film or amorphous silicon semiconductor film has a sufficient energy density to melt the polycrystalline or amorphous silicon semiconductor film.

21. A method according to claim 18, wherein the insulating film is formed of a material selected from the group consisting of $SiO_2$, $Si_3N_4$, $Al_2O_3$ and phosphorous glass.

22. A method according to claim 20, wherein the insulating film is formed of a material selected from the group consisting of $SiO_2$, $Si_3N_4$, $Al_2O_3$ and phosphorous glass.

23. A method of fabricating a semiconductor device, comprising:
   (a) coating a surface of a single-crystalline silicon semiconductor substrate at a desired portion with an insulating film; the desired portion of the substrate having the insulating film formed thereon, in cross-section, having exposed substrate on both sides thereof;
   (b) coating said single crystalline silicon semiconductor substrate and said insulating film with either a polycrystalline silicon semiconductor film or an amorphous silicon semiconductor film such that at least a portion of the exposed surface of the single-crystalline silicon semiconductor substrate and a desired portion of the insulating film are continuously covered, the polycrystalline silicon semiconductor film or amorphous silicon semiconductor film being coated to continuously cover the exposed substrate on one side of the insulating film and at least a first portion of the insulating film, and to continuously cover the exposed substrate on the other side of the insulating film and at least a second portion of the insulating film;
   (c) irradiating the polycrystalline silicon semiconductor film or said amorphous silicon semiconductor film on the exposed surface of the single-crystalline silicon semiconductor substrate and on the desired portion of the insulating film with a laser beam so that at least a portion of the irradiated film on said desired portion and the irradiated film on the exposed surface of the substrate is single-crystallized, so as to form a single-crystalline silicon semiconductor film continuously coating both the surface of said single-crystalline silicon semiconductor substrate and the desired portion of said insulating film, said single-crystalline semiconductor substrate acting as a seed for the single-crystallizing of said at least a portion of the irradiated film on the exposed surface of the single-crystalline silicon semiconductor substrate, at least a part of the polycrystalline silicon semiconductor film or amorphous silicon semiconductor film on the exposed substrate on both sides and on at least desired portions of the insulating film being irradiated with a laser beam so that at least a portion of the irradiated film on the exposed substrate on both sides of the insulating film and on the insulating film is single crystallized, and so that the single crystallization of the polycrystalline or amorphous semiconductor film proceeds in a direction from both sides of the insulating film to the insulating film, and
   (d) forming at least one pn-junction in the single-crystallized portion of the semiconductor film.

24. A method according to claim 23, wherein, in the coating step (b), the entire insulating film is coated with the polycrystalline or amorphous silicon semiconductor film, whereby the polycrystalline or amorphous silicon semiconductor film extends continuously from the exposed substrate at one side of the insulating film to the exposed substrate at the other side of the insulating film.

25. A method according to claim 24, wherein, in the forming step (c), the polycrystalline or amorphous silicon semiconductor film on the exposed substrate on both sides and on the insulating film are irradiated with a laser beam so that the irradiated film on the exposed substrate on both sides and on the insulating film is single-crystallized to form a continuous single-crystalline silicon semiconductor film extending from the exposed substrate at one side of the insulating film, across the insulating film, to the exposed substrate on the other side of the insulating film, with the single-crystallization proceeding in a direction from both sides of the insulating film to the insulating film.

26. A method of fabricating a semiconductor device, comprising:
   (a) coating a surface of a single-crystalline silicon semiconductor substrate at a desired portion with an insulating film;
   (b) coating said single crystalline silicon semiconductor substrate and said insulating film with either a polycrystalline silicon semiconductor film or an amorphous silicon semiconductor film such that at least a portion of the exposed surface of the single-crystalline silicon semiconductor substrate and a desired portion of the insulating film are continuously covered;
   (c) irradiating the polycrystalline silicon semiconductor film or said amorphous silicon semiconductor film on the exposed surface of the single-crystalline silicon semiconductor substrate and on the desired portion of the insulating film with a laser beam so that at least a portion of the irradiated film on said desired portion and the irradiated film on the exposed surface of the substrate is single-crystallized, so as to form a single-crystalline silicon semiconductor film continously coating both the surface of said single-crystalline silicon semiconductor substrate and the desired portion of said insulating film, said single-crystalline silicon semiconductor substrate acting as a seed for the single-crystallizing of said at least a portion of the irradiated film on said desired portion and said irradiated film on the exposed surface of the single-crystalline silicon semiconductor substrate;
   (d) forming at least one pn-junction in the single-crystallized portion of the semiconductor film;
   (e) coating a portion of the surface of the single-crystallized portion of the semiconductor film with another insulating film;
   (f) coating the exposed surface of the single-crystallized portion and the another insulating film with either a polycrystalline silicon semiconductor film or an amorphous silicon semiconductor film such that at least a portion of the exposed surface of the single-crystallized portion and a desired portion of the another insulating film are continuously covered;
   (g) irradiating the polycrystalline or amorphous silicon film on the single-crystallized portion and on the desired portion of the another insulating film with a laser beam so that at least a portion of the irradiated film on said desired portion of the another insulating film and the irradiated film on the exposed surface of the single-crystallized portion is single-crystallized, so as to form a second single-crystalline silicon semiconductor film continuously coating both the surface of the single-crystallized portion and the desired portion of the another insulating film; and
   (h) forming at least one pn-junction in the single-crystallized portion of the another semiconductor film, whereby dual-level single-crystalline semiconductor films are formed.

27. A method according to claim 26, wherein at least one semiconductor element having at least one region thereof in said single-crystallized portion of the semiconductor film is formed, and wherein at least one other semiconductor element having at least one region thereof in said second single-crystallized portion of the semiconductor film is formed.

28. A method according to claim 26, wherein at least one of the at least one pn-junctions is formed in the single-crystallized portion of the another semiconductor film on said desired portion of the second insulating film.

29. A method of fabricating a semiconductor device, comprising:
   (a) coating a surface of a single-crystalline silicon semiconductor substrate at a desired portion with an insulating film;
   (b) coating said single crystalline silicon semiconductor substrate and said insulating film with either a polycrystalline silicon semiconductor film or an amorphous silicon semiconductor film such that at least a portion of the exposed surface of the single-crystalline silicon semiconductor substrate and a desired portion of the insulating film are continuously covered;
   (c) irradiating the polycrystalline silicon semiconductor film or said amorphous silicon semiconductor film on the exposed surface of the single-crystalline silicon semiconductor substrate and on the desired portion of the insulating film with a laser beam so that at least a portion of the irradiated film on said desired portion and the irradiated film on the exposed surface of the substrate is single-crystallized, so as to form a single-crystalline silicon semiconductor film continuously coating both the surface of said single-crystalline silicon semiconductor substrate and the desired portion of said insulating film, said single-crystalline silicon semiconductor substrate acting as a seed for the single-crystallizing of said at least a portion of the irradiated film on said desired portion and said irradiated film on the exposed surface of the single-crystalline silicon semiconductor substrate; and
   (d) forming at least one pn-junction in the single-crystallized portion of the semiconductor film, said pn-junction being formed in the single-crystallized portion of the semiconductor film on said desired portion of the insulating film.

30. A method according to claim 29, wherein the steps (e), (f), (g) and (h) are repeated to thereby form additional levels of single-crystalline silicon semiconductor film.

31. A method of fabricating a semiconductor device, comprising:
   (a) coating a surface of a single-crystalline silicon semiconductor substrate at a desired portion with an insulating film;
   (b) coating said single crystalline silicon semiconductor substrate and said insulating film with either a polycrystalline silicon semiconductor film or an amorphous silicon semiconductor film such that at least a portion of the exposed surface of the single-crystalline semiconductor substrate and a desired portion of the insulating film are continuously convered;

(c) irradiating the polycrystalline silicon semiconductor film or said amorphous silicon semiconductor film on the exposed surface of the single-crystalline silicon semiconductor substrate and on the desired portion of the insulating film with a laser beam so that at least a portion of the irradiated film on said desired portion and the irradiated film on the exposed surface of the substrate is single-crystallized, so as to form a single-crystalline silicon semiconductor film continuously coating both the surface of said single-crystalline silicon semiconductor substrate and the desired portion of said insulating film, said single-crystalline silicon semiconductor substrate acting as a seed for the single-crystallizing of said at least a portion of the irradiated film on said desired portion and said irradiated film on the exposed surface of the single-crystalline silicon semiconductor substrate, said irradiating being performed to melt the film on the exposed surface of the substrate and to single-crystallize the film on the exposed surface and to effect single-crystalline growth from the end portion of the single-crystallized film on the exposed surface of the substrate to single-crystallize said at least a portion of the irradiated film on said desired portion of the insulating film.

32. A method according to claim 31, wherein the film on the exposed surface of the substrate is single-crystallized by liquid phase epitaxial growth of the melt of the film on the exposed surface of the substrate.

33. A method according to claim 31, wherein said irradiating is performed for a sufficiently long time so as to elongate the holding time period of the molten state to single-crystallize the film on the exposed surface of the substrate.

34. A method of fabricating a semiconductor device, comprising:

(a) coating a surface of a single-crystalline silicon semiconductor substrate at a desired portion with an insulating film;

(b) coating said single crystalline silicon semiconductor substrate and said insulating film with either a polycrystalline silicon semiconductor film or an amorphous silicon semiconductor film such that at least a portion of the exposed surface of the single-crystalline silicon semiconductor substrate and a desired portion of the insulating film are continuously convered;

(c) irradiating the polycrystalline silicon semiconductor film or said amorphous silicon semiconductor film on the exposed surface of the single-crystalline silicon semiconductor substrate and on the desired portion of the insulating film with a laser beam so that at least a portion of the irradiated film on said desired portion and the irradiated film on the exposed surface of the substrate is single-crystallized, so as to form a single-crystalline silicon semiconductor film continuously coating both the surface of said single-crystalline silicon semiconductor substrate and the desired portion of said insulating film, said single-crystalline silicon semiconductor substrate acting as a seed for the single-crystallizing of said at least a portion of the irradiated film on said desired portion and said irradiated film on the exposed surface of the single-crystalline silicon semiconductor substrate;

(d) forming at least one pn-junction in the single-crystallized portion of the semiconductor film; and (e) forming at least one semiconductor element having at least one region thereof in said single-crystallized portion of the semiconductor film.

35. A method according to claim 34, wherein said at least one region includes at least one low resistance region formed in said single-crystallized portion of the semiconductor film.

36. A method according to claim 35, wherein said at least one low resistance region is formed on said desired portion of the insulating film.

37. A method according to claim 34, wherein said at least one semiconductor element includes at least one field effect transistor.

38. A method according to claim 37, wherein all regions of the field effect transistor are formed in the single-crystallized portion of the semiconductor film on the desired portion of the insulating film.

* * * * *